United States Patent
Wang

(10) Patent No.: US 8,436,761 B2
(45) Date of Patent: May 7, 2013

(54) ANALOG-TO-DIGITAL CONVERTER DIGITALLY CONTROLLED ACCORDING TO ANALOG INPUT SIGNAL AND FEEDBACK SIGNAL

(76) Inventor: Ping-Ying Wang, Hsinchu (TW)

( * ) Notice: Subject to any disclaimer, the term of this patent is extended or adjusted under 35 U.S.C. 154(b) by 46 days.

(21) Appl. No.: 13/282,101

(22) Filed: Oct. 26, 2011

(65) Prior Publication Data

US 2012/0098685 A1   Apr. 26, 2012

(30) Foreign Application Priority Data

Oct. 26, 2010   (TW) ................................ 99136495 A

(51) Int. Cl.
*H03M 1/34*   (2006.01)

(52) U.S. Cl.
USPC ........... 341/163; 323/234; 323/283; 323/271; 323/285; 323/222; 341/155; 341/165; 341/158; 341/160

(58) Field of Classification Search .......... 341/155–165; 323/222, 234, 283, 271, 285
See application file for complete search history.

(56) References Cited

U.S. PATENT DOCUMENTS

| | | | |
|---|---|---|---|
| 6,969,300 B2* | 11/2005 | Himmer | 451/10 |
| 6,969,981 B1* | 11/2005 | Fairbanks et al. | 323/299 |
| 6,977,830 B2* | 12/2005 | Lee et al. | 363/89 |
| 7,969,754 B2* | 6/2011 | Radecker et al. | 363/21.03 |
| 8,049,474 B2* | 11/2011 | Bernacchia et al. | 323/272 |
| 2012/0025793 A1* | 2/2012 | Tai et al. | 323/271 |
| 2012/0126766 A1* | 5/2012 | Chen | 323/283 |
| 2012/0139507 A1* | 6/2012 | Ferguson | 323/234 |

* cited by examiner

Primary Examiner — Lam T Mai
(74) Attorney, Agent, or Firm — Birch, Stewart, Kolasch & Birch, LLP

(57) ABSTRACT

An analog-to-digital converter including a comparator, a control module, a voltage adjusting module, and an evaluating module is provided. The comparator compares an analog input voltage with a feedback voltage and generates a comparison result. Based on the comparison result, the control module generates a control signal. The voltage adjusting module increases or decreases the feedback voltage toward the analog input voltage according to the control signal. The voltage increase amount and decrease amount provided by the voltage adjusting module are corresponding to a first digital value and a second digital value, respectively. The evaluating module generates the first digital value and the second digital value based on the control signal. According to the first digital value and the second digital value, a digital signal corresponding to the analog input voltage is generated.

19 Claims, 7 Drawing Sheets

ANALOG-TO-DIGITAL CONVERTER DIGITALLY CONTROLLED ACCORDING TO ANALOG INPUT SIGNAL AND FEEDBACK SIGNAL

CROSS-REFERENCE TO RELATED APPLICATIONS

This application is based upon and claims the benefit of priority to Taiwanese Patent Application No. 099136495, filed on Oct. 26, 2010; the entire content of which is incorporated herein by reference for all purpose.

BACKGROUND

The present invention relates to voltage converting circuits. In particular, the present invention relates to analog-to-digital converters.

Compared with analog signals, digital signals can be more easily processed and stored. Therefore, analog-to-digital converters are important and widely used in communication systems, multimedia systems, and computer systems. At the present time, the architectures of analog-to-digital converters are generally complicated. Besides, most of the analog-to-digital converters include many capacitive components occupying huge areas in the chip. The hardware cost of analog-to-digital converters is accordingly high.

SUMMARY

To solve the aforementioned problems, new structures for analog-to-digital converters are proposed in the invention. After comparing an analog input voltage with a feedback voltage, an analog-to-digital converter according to the invention can estimate the analog input voltage based on the voltage increasing/decreasing amounts used on the comparing process. A digital signal corresponding to the analog input voltage can then be generated by digital circuits easily. The structure of the analog-to-digital converters according to the invention is simple and can be implemented with low cost.

One embodiment according to the invention is an analog-to-digital converter including a comparator, a control module, a voltage adjusting module, and an evaluating module. The comparator compares an analog input voltage with a feedback voltage and generates a comparison result. Based on the comparison result, the control module generates a control signal. The voltage adjusting module increases or decreases the feedback voltage toward the analog input voltage according to the control signal. The voltage increase amount and decrease amount provided by the voltage adjusting module are corresponding to a first digital value and a second digital value, respectively. The evaluating module generates the first digital value and the second digital value based on the control signal. According to the digital values, a digital signal corresponding to the analog input voltage is generated.

The advantage and spirit of the invention may be understood by the following recitations together with the appended drawings.

DETAILED DESCRIPTION

Figure 1:
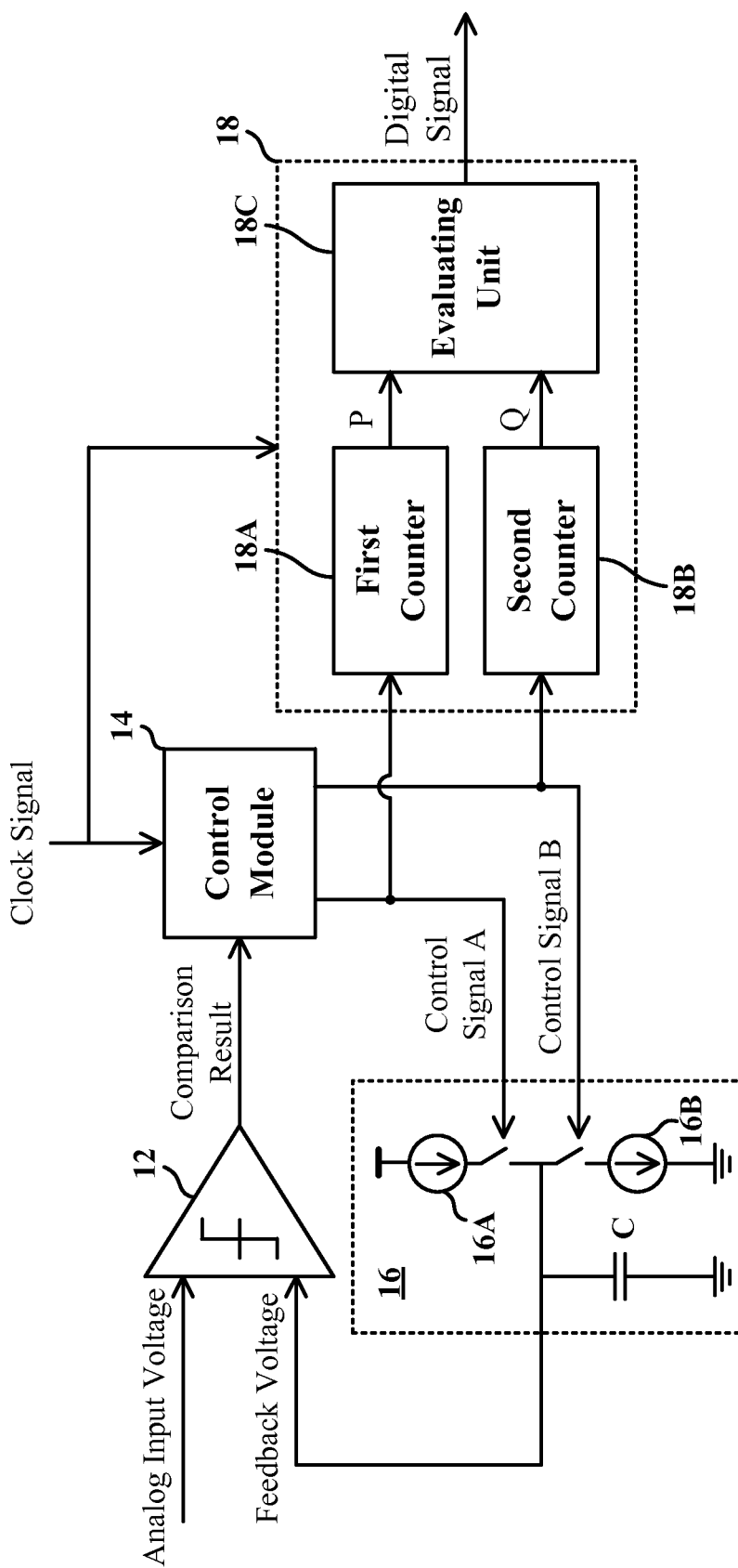
FIG. 1 illustrates the block diagram of the analog-to-digital converter in one embodiment according to the invention.

One embodiment according to the invention is the analog-to-digital converter shown in FIG. 1. This analog-to-digital converter includes a comparator 12, a control module 14, a voltage adjusting module 16, and an evaluating module 18. As shown in FIG. 1, the comparator 12 compares an analog input voltage with a feedback voltage, so as to generate a comparison result. For instance, the comparison result can have two levels. When the analog input voltage is higher than the feedback voltage, the comparison result has a first voltage level $V_1$. When the analog input voltage is lower than the feedback voltage, the comparison result has a second voltage level $V_2$ different from the first voltage level $V_1$. In the following description, the condition that the first voltage level $V_1$ is high and the second voltage level $V_2$ is low is taken as an example.

Based on the comparison result provided by the comparator 12, the control module 14 generates a set of control signals for controlling the voltage adjusting module 16. The voltage adjusting module 16 includes two current sources and a capacitive component. The capacitive component C is coupled between the ground node and an input end of the comparator 12 for receiving the feedback voltage. Hence, the voltage drop across the capacitive component C is the feedback voltage. The switch between the capacitive component C and the charge current source 16A is controlled by the control signal A. When the control signal A has a high voltage level, the charge current source 16A is coupled to the capacitive component C and charges the capacitive component C. The switch between the capacitive component C and the discharge current source 16B is controlled by the control signal B. When the control signal B has a high voltage level, the discharge current source 16B is coupled to the capacitive component C and discharges the capacitive component C.

Figure 2A:
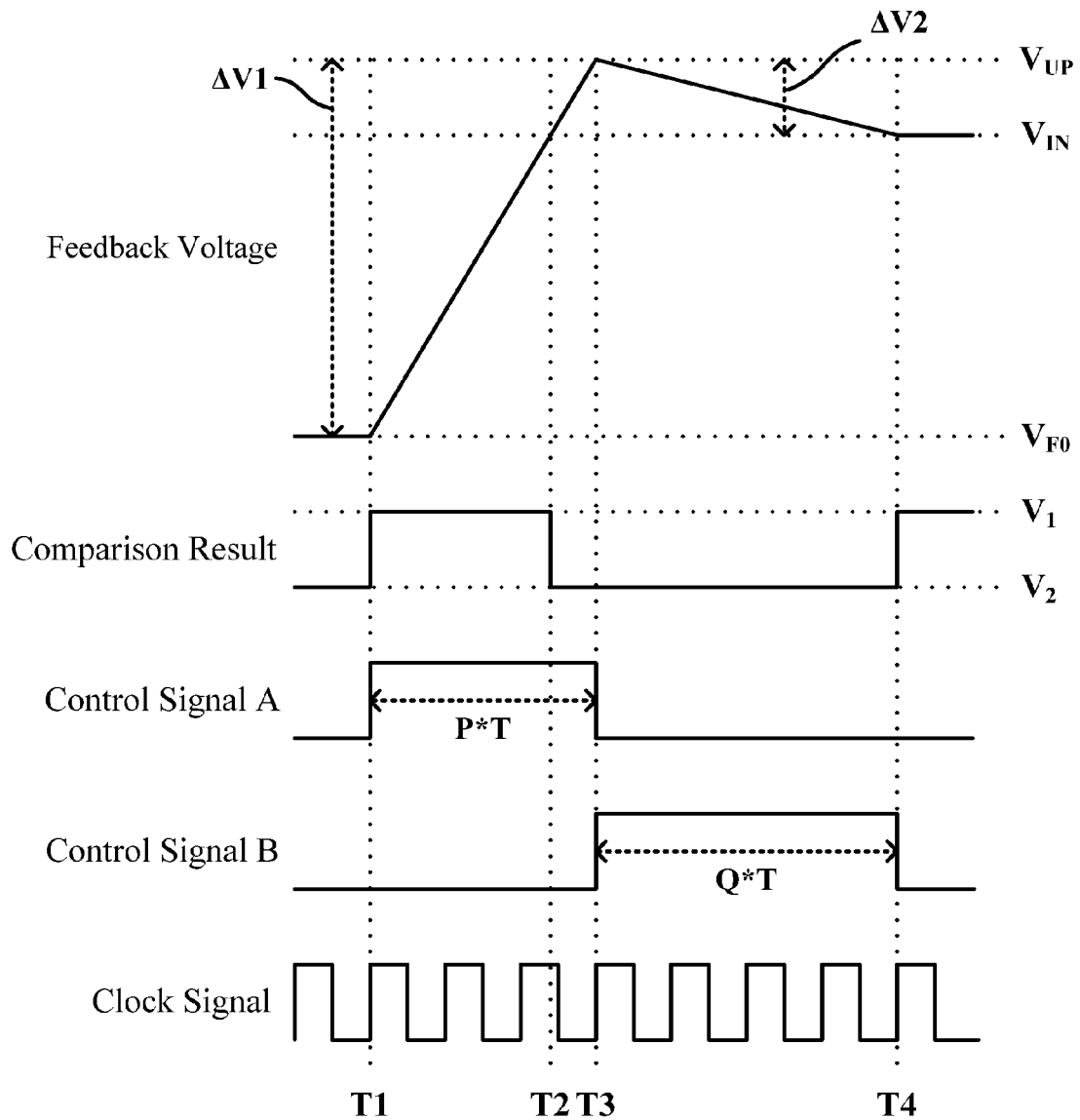
FIG. 2(A) and FIG. 2(B) are exemplary timing diagrams of the signals in the analog-to-digital converter.

FIG. 2(A) illustrates an exemplary timing diagram of the signals. Since time instant T1, the comparator 12 starts to provide the comparison result. In this example, the analog input voltage $V_{IN}$ is higher than the initial feedback voltage $V_{F0}$ of the feedback voltage. Accordingly, the comparison result first has the first voltage level $V_1$. The digital circuits in the control module 14 can operate according to rising edges of a clock signal. At time instant T1, being triggered by the comparison result and the rising edge of the clock signal, the control module 14 sets the control signal A as having a high level. Therefore, the charge current source 16A starts to charge the capacitive component C. As shown in FIG. 2(A), the feedback voltage increases since time instant T1.

At time instant T2, the feedback voltage is raised to substantially equal to the analog input voltage $V_{IN}$. Since there is no rising edge in the clock signal before time instant T3, the control module 14 resets the control signal A to a low level until time instant T3. Between time instants T2 and T3, under the control of the control signal A, the charge current source 16A keeps charging the capacitive component C. Hence, at time instant T3, the feedback voltage is raised to $V_{UP}$ higher than the analog input voltage $V_{IN}$.

At time instant T3, besides changing the control signal A to a low level, the control module 14 also changes the control signal B from low to high, so as to request the discharge current source 16B to start discharging the capacitive component C. As shown in FIG. 2(A), at time instant T4, the feedback voltage is decreased to a level slightly lower than the analog input voltage $V_{IN}$. Therefore, the comparison result changes from low to high at time instant T4. Triggered by this change, at time instant T4, the control module 14 sets the control signal B to low, so as to request the discharge current source 16B to stop discharging the capacitive component C.

The charge current source 16A provides a charge current I1, and the discharge current source 16B provides a discharge current I2. In this embodiment, the charge current I1 is N times of the discharge current I2, wherein N is a positive number larger than one. For example, the charge current I1 can be designed as sixteen times of the discharge current I2. The increasing rate of the feedback voltage between time instants T1 and T3 is associated with the amount of the charge current I1. Moreover, the voltage increase amount ΔV1 is directly proportional to both the amount of the charge current I1 and the length of charging duration. In the example shown in FIG. 2(A), the charging duration is equal to P periods T. On the contrary, the decreasing rate of the feedback voltage between time instants T3 and T4 is associated with the amount of the charge current I2. The voltage decrease amount ΔV2 is directly proportional to both the amount of the discharge current I2 and the length of discharging duration. In the example shown in FIG. 2(A), the discharging duration is equal to Q periods T. P and Q are positive integers.

More specifically, the voltage increase amount ΔV1 is the product of a voltage increasing rate and the voltage increasing duration P*T. The voltage increasing rate is the result of dividing the charge current I1 by the capacitive value of the capacitive component C. The voltage decrease amount ΔV2 is the product of a voltage decreasing rate and a voltage decreasing duration Q*T. The voltage decreasing rate is the result of dividing the discharge current I2 by the capacitive value of the capacitive component C. In this embodiment, the charge current I1 and discharge current I2 are fixed. In practice, the two currents can be designed as the function of time, respectively. For example, the charge current I1 can charge the capacitive component C with a current amount I1A in the first period T after time instant T1. Subsequently, the charge current I1 charges the capacitive component C with a current amount I1B in the other periods. In other words, the charge current I1 can be designed as adjustable. Taking advantage of this design, the control module 14 can adjust the voltage increasing rate more flexibly.

Based on the above descriptions, the voltage increase amount ΔV1 can be represented as $$\frac{I1*(P*T)}{C},$$

and the voltage decrease amount ΔV2 can be represented as $$\frac{I2*(Q*T)}{C}.$$

In practice, the values of I1, I2, C and T are known previously. Therefore, as long as P and Q are found, the voltage increase amount ΔV1 and the voltage decrease amount ΔV2 can be estimated. As shown in FIG. 2(A), the analog input voltage $V_{IN}$ can be calculated by subtracting the voltage decrease amount ΔV2 from the sum of the initial feedback voltage $V_{F0}$ and the voltage increase amount ΔV1. Since the initial feedback voltage $V_{F0}$ can be previously known or accurately controlled, the analog input voltage $V_{IN}$ can accordingly be estimated as long as P and Q are found.

As shown in FIG. 1, the evaluating module 18 includes a first counter 18A, a second counter 18B, and an evaluating unit 18C. Based on the control signal A and the clock signal, the first counter 18A counts when the charge current source 16A charges the capacitive component C, so as to generate a first counting result. The first counting result is the aforementioned value P. Based on the control signal B and the clock signal, the second counter 18B counts when the discharge current source 16B discharges the capacitive component C, so as to generate a second counting result. The second counting result is the aforementioned value Q. In practice, the function of the first counter 18A and the second counter 18B can be integrated in one counter.

Each count in the P counts represents a unit charge amount, and each count in the Q counts represents a unit discharge amount. As described above, the charge current I1 is N times of the discharge current I2. Taking N=16 as an example, the unit charge amount is sixteen times of the unit discharge amount. Accordingly, the first counting result P must be multiplied by N. The evaluating unit 18C can generate a digital signal corresponding to the analog input voltage $V_{IN}$ by subtracting the second counting result Q from the product of N and the first counting result P. In other words, a digital signal corresponding to the analog input voltage $V_{IN}$ can be generated by simply calculating (P*N−Q). Since the first counting result P and second counting result Q are both digital signals, the evaluating unit 18C can generate the digital signal corresponding to the analog input voltage $V_{IN}$ simply with a multiplier and a subtractor. No complicated circuits are required. In practice, the first counter 18A, the second counter 18B, and the evaluating unit 18C can also be integrated in a counter with basic calculation functions.

Utilizing a charge current I1 larger than the discharge current I2 can increase the speed of raising the feedback voltage up (i.e. can advance time instants T2 and T3). The operation efficiency of the analog-to-digital converter can accordingly be improved. Besides, utilizing a discharge current I2 smaller than the charge current I1 can provide the effect of fine-tuning the feedback voltage. The smaller the discharge current I2 is, the smaller the discharge amount provided by the discharge current source 16B in one period is. Taking FIG. 2(A) as an example, the feedback voltage at time instant T4 is only slightly higher than the analog input voltage $V_{IN}$.

Figure 3:
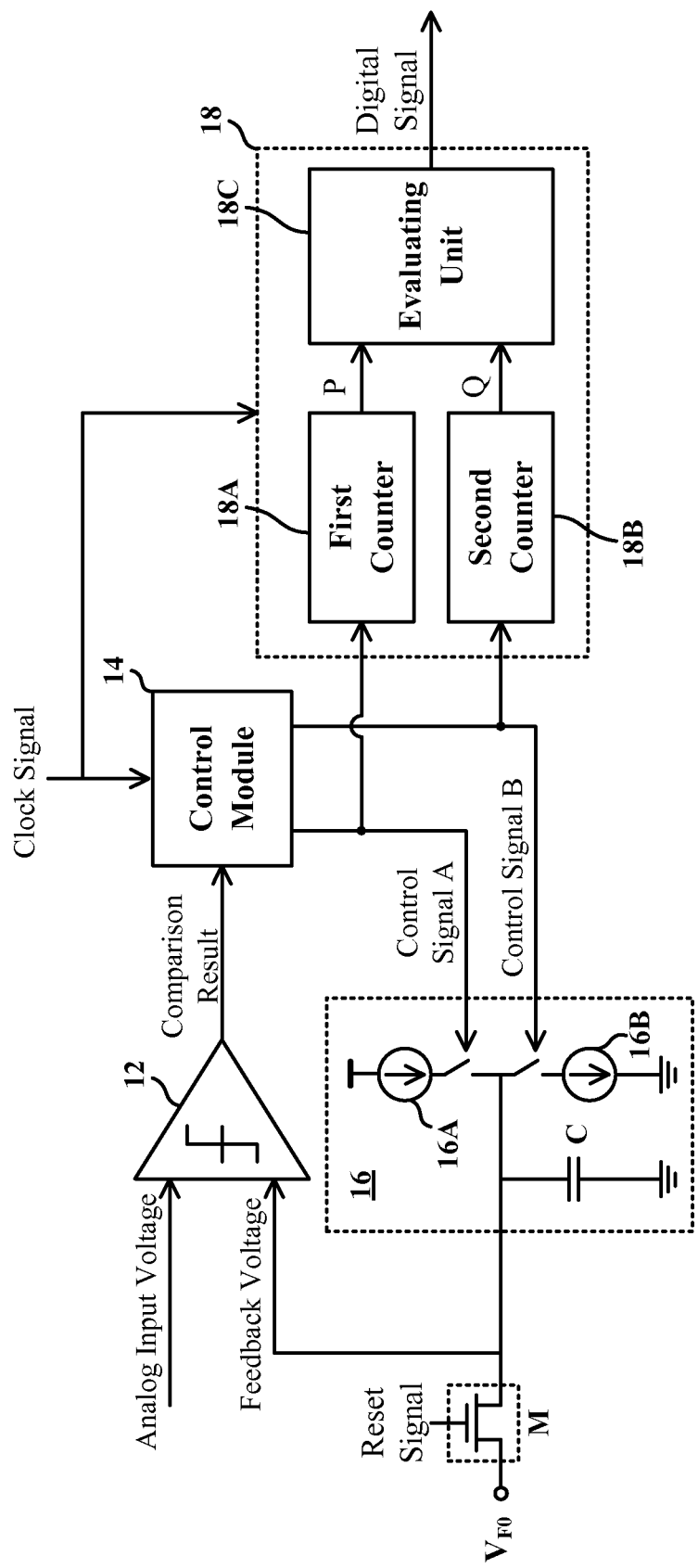
FIG. 3 illustrates an analog-to-digital converter further including a reset module.

As described above, the analog input voltage $V_{IN}$ can be calculated by subtracting the voltage decrease amount ΔV2 from the sum of the initial feedback voltage $V_{F0}$ and the voltage increase amount ΔV1. The initial feedback voltage $V_{F0}$ is controllable. As shown in FIG. 3, the analog-to-digital converter according to the invention can further include a reset module M for resetting the feedback voltage to the initial feedback voltage $V_{F0}$ before the voltage adjusting module 16 starts to adjust the feedback voltage. In this example, the reset module is a switch. The initial feedback voltage $V_{F0}$ can be set according to practical needs. For instance, the initial feedback voltage $V_{F0}$ can be set as, but not limited to, a ground voltage or a power supply voltage.

Figure 4:
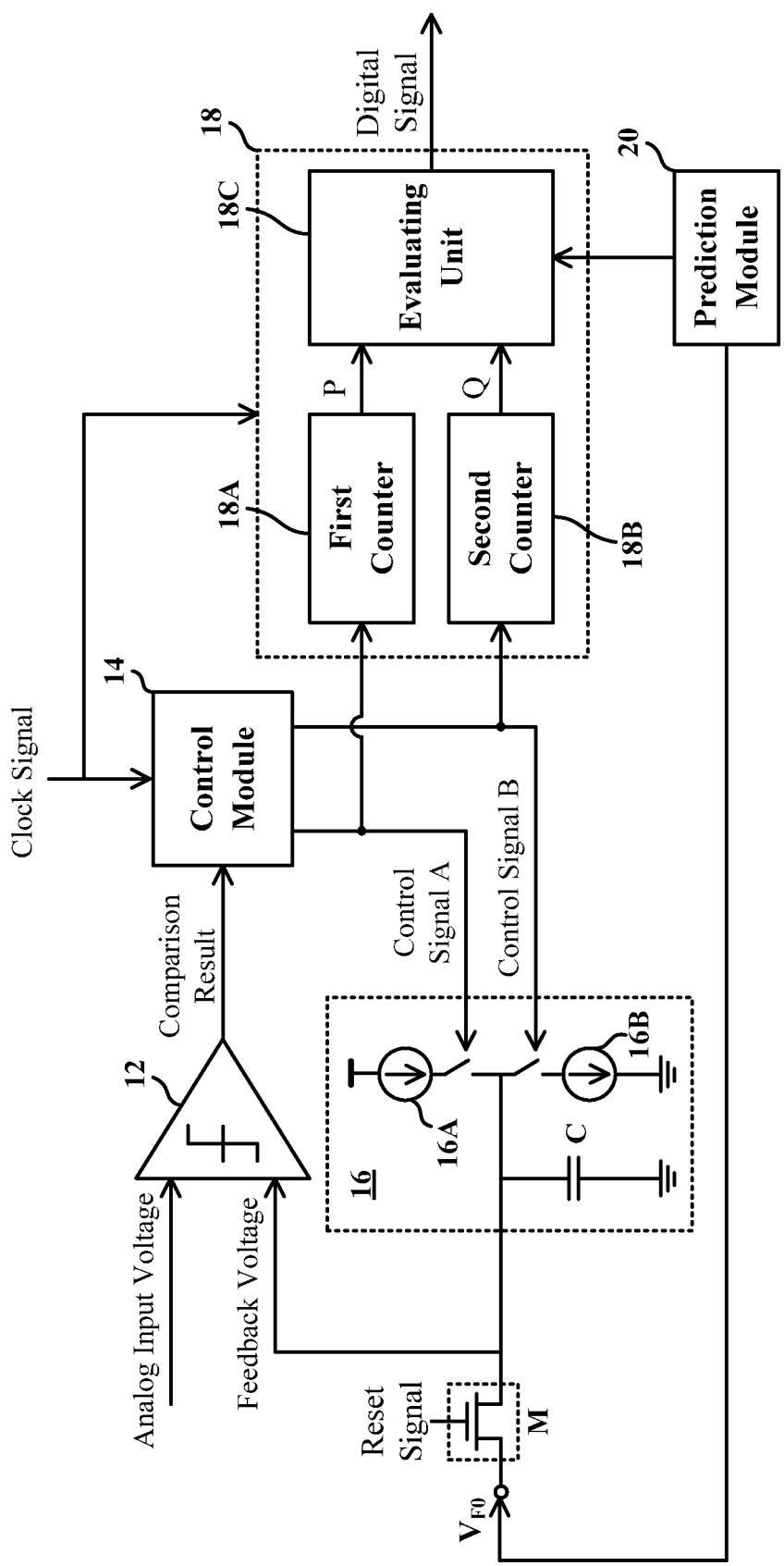
FIG. 4 illustrates an analog-to-digital converter further including an evaluating module.

FIG. 4 illustrates another embodiment further including a prediction module 20. The prediction module 20 is used for determining the initial feedback voltage $V_{F0}$ based on a history of the digital signal or a characteristic of the analog input voltage. In one embodiment, the prediction module 20 can determine the prediction value of a following digital signal and its corresponding initial feedback voltage $V_{F0}$ by extrapolation based on previous digital signals. In another embodiment, the prediction module 20 predicts a possible range of the following digital signal based on previously known frequency/amplitude characteristics of the analog input voltage. If an initial feedback voltage $V_{F0}$ close to the final feedback voltage is selected, the duration that the feedback voltage approaches the analog input voltage can be shorten. Besides providing an initial feedback voltage $V_{F0}$ to the reset module M, the prediction module 20 also provides a corresponding initial counting value to the evaluating unit 18C. Assuming the initial feedback voltage $V_{F0}$ is corresponding to a third digital value, the evaluating unit 18C can generate the digital signal by subtracting Q from the sum of P*N and the third digital value.

Figure 2B:
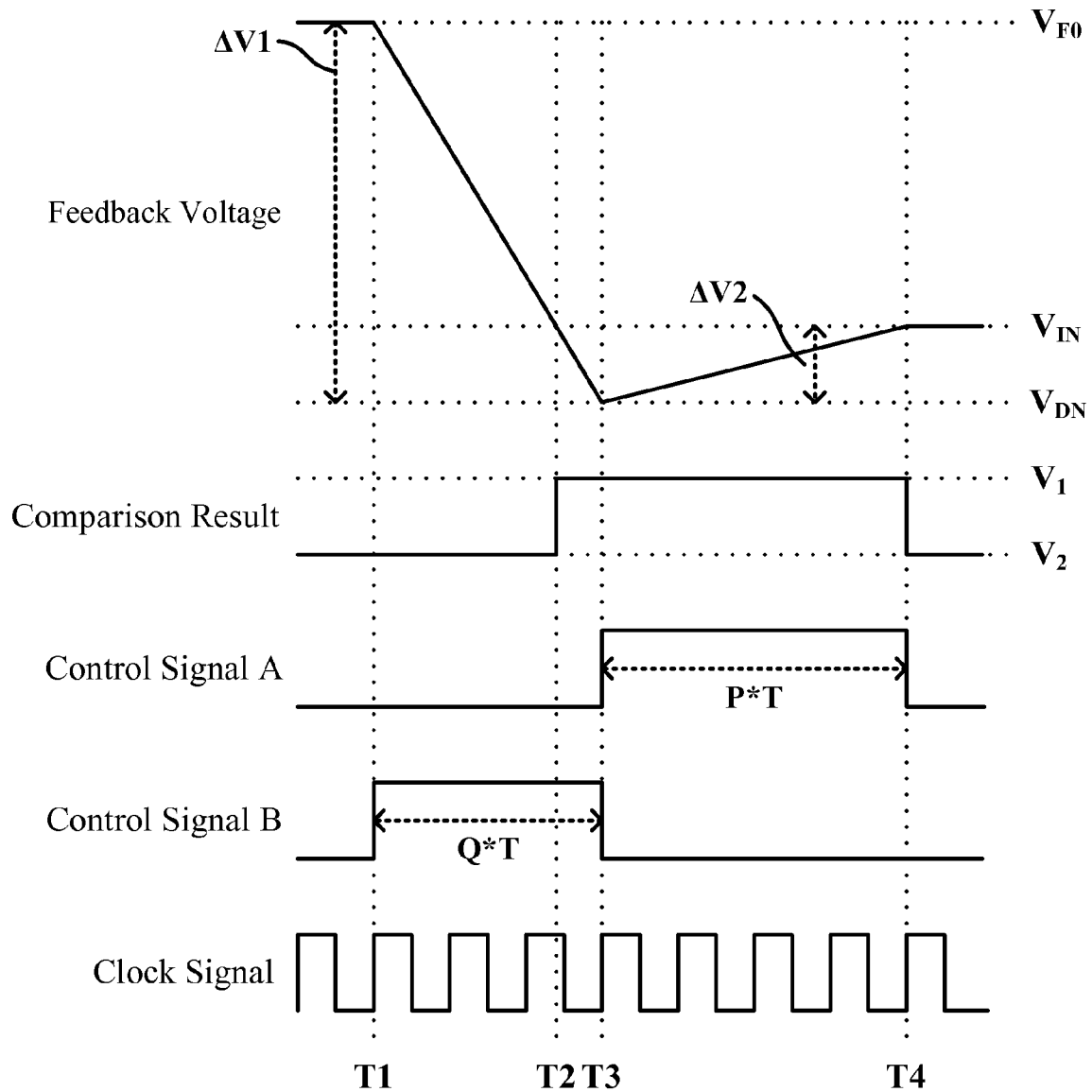

FIG. 2(B) illustrates another exemplary timing diagram of the signals. In this example, the analog input voltage $V_{IN}$ is lower than the feedback voltage $V_{F0}$. Hence, the comparison result first has the second voltage level $V_2$. At time instant T1, being triggered by the comparison result and the rising edge of the clock signal, the control module 14 sets the control signal B as having a high level. Therefore, the discharge current source 16B starts to discharge the capacitive component C. As shown in FIG. 2(B), the feedback voltage decreases since time instant T2.

At time instant T2, the feedback voltage is decreased to substantially equal to the analog input voltage $V_{IN}$. Since there is no rising edge in the clock signal before time instant T3, the control module 14 resets the control signal B to a low level until time instant T3. Between time instants T2 and T3, under the control of the control signal B, the discharge current source 16B keeps discharging the capacitive component C. Hence, at time instant T3, the feedback voltage is decreased to $V_{DN}$ lower than the analog input voltage $V_{IN}$.

At time instant T3, besides changing the control signal B to a low level, the control module 14 also changes the control signal A from low to high, so as to request the charge current source 16A to start charging the capacitive component C. As shown in FIG. 2(B), at time instant T4, the feedback voltage is increased to a level slightly higher than the analog input voltage $V_{IN}$. Therefore, the comparison result changes from high to low at time instant T4. Triggered by this change, at time instant T4, the control module 14 sets the control signal A to low, so as to request the charge current source 16A to stop charging the capacitive component C.

In this embodiment, the charge current I1 can be designed as N times of the discharge current I2. It is noted the ratio N can be a positive number smaller than one. Similarly, the evaluating unit 18C can generate a digital signal corresponding to the analog input voltage $V_{IN}$ by calculating (P*N−Q). Further, the evaluating unit 18C can also take the initial feedback voltage into consideration.

Figure 5:
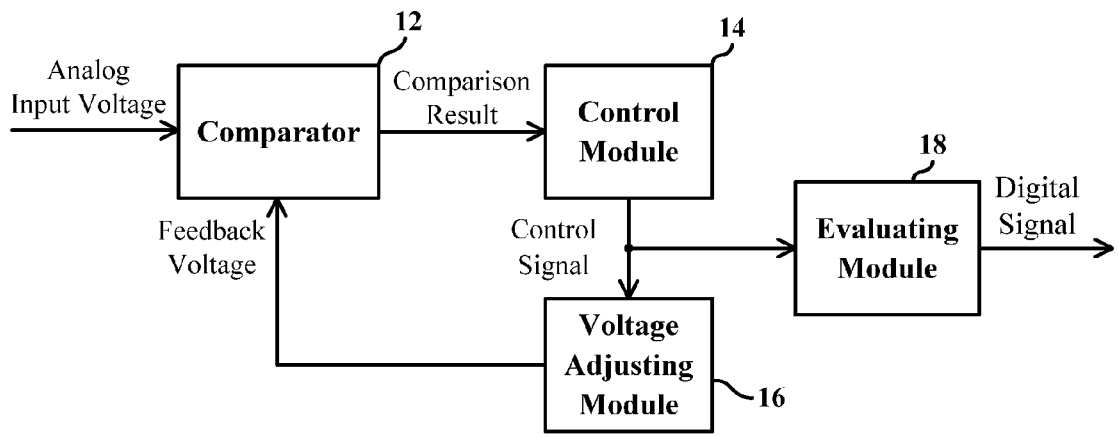
FIG. 5 shows an exemplary architecture of the analog-to-digital converter according to the invention.

Based on the above descriptions, the analog-to-digital converter according to the invention can be represented by the block diagram shown in FIG. 5. The comparator 12 is used for comparing an analog input voltage with a feedback voltage, so as to generate a comparison result. The control module 14 generates a control signal based on the comparison result. The voltage adjusting module 16 is controlled by the control signal. The voltage adjusting module 16 increases or decreases the feedback voltage toward the analog input voltage according to the control signal. Based on the control signal, the evaluating module 18 generates a first digital value P and a second digital value Q. Subsequently, the evaluating module 18 generates a digital signal corresponding to the analog input voltage based on the two digital values.

Figure 6:
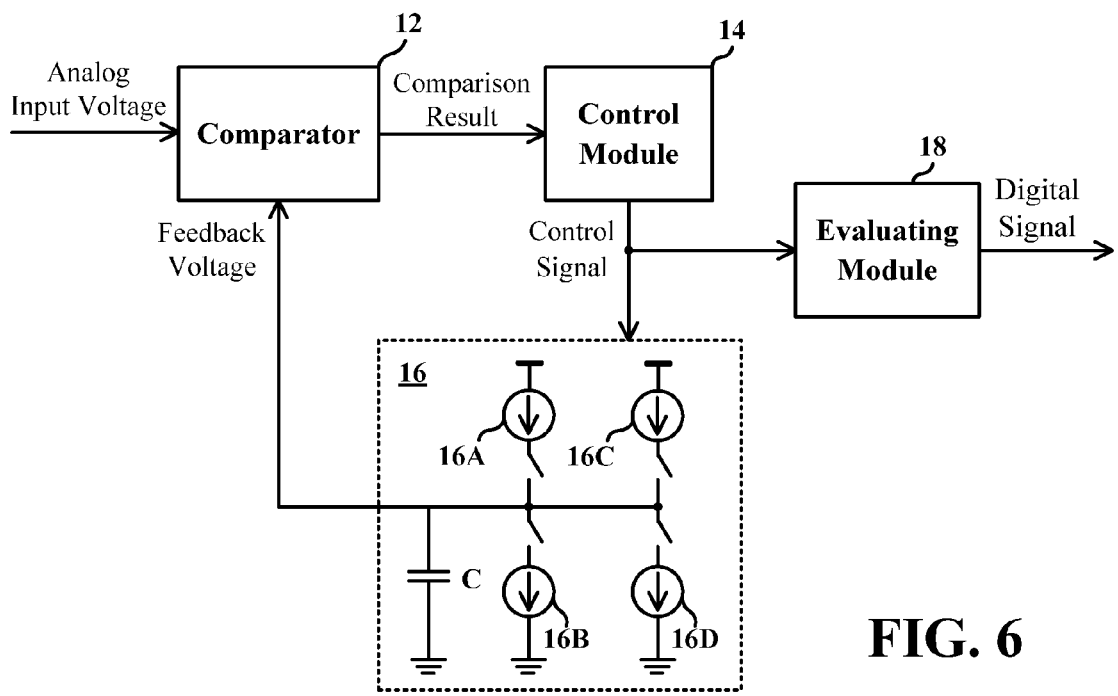
FIG. 6 is used for illustrating another embodiment of the voltage adjusting module according to the invention.

FIG. 6 illustrates another embodiment of the voltage adjusting module 16. In this example, the voltage adjusting module 16 includes two charge current sources 16A/16C and two discharge current sources 16B/16D. The current amount of the charge current source 16A is N times of current amount of the discharge current source 16B. The current amount of the discharge current source 16D is M times of current amount of the charge current source 16C. M and N are both positive numbers larger than one. In practice, the charge current sources can be implemented by switches coupled between the capacitive component C and the power supply node. When the switches are turned on, the capacitive component C is charged. Similarly, the discharge current sources can be implemented by switches coupled between the capacitive component C and the ground node. When the switches are turned on, the capacitive component C is discharged.

In this example, if the analog input voltage is higher than the initial feedback voltage, the control module 14 first increases the feedback voltage by controlling the charge current source 16A until the comparison result changes. Subsequently, the control module 14 inversely adjusts the feedback voltage by the discharge current source 16B until the comparison result changes again. As described above, the evaluating module 18 can generate a digital signal corresponding to the analog input voltage by calculating (P*N−Q). On the contrary, if the analog input voltage is lower than the initial feedback voltage, the control module 14 first decreases the feedback voltage by controlling the discharge current source 16D until the comparison result changes. Subsequently, the control module 14 inversely adjusts the feedback voltage by the charge current source 16C until the comparison result changes again. In this condition, the evaluating module 18 can generate a digital signal corresponding to the analog input voltage by calculating (P−Q*M).

Figure 7:
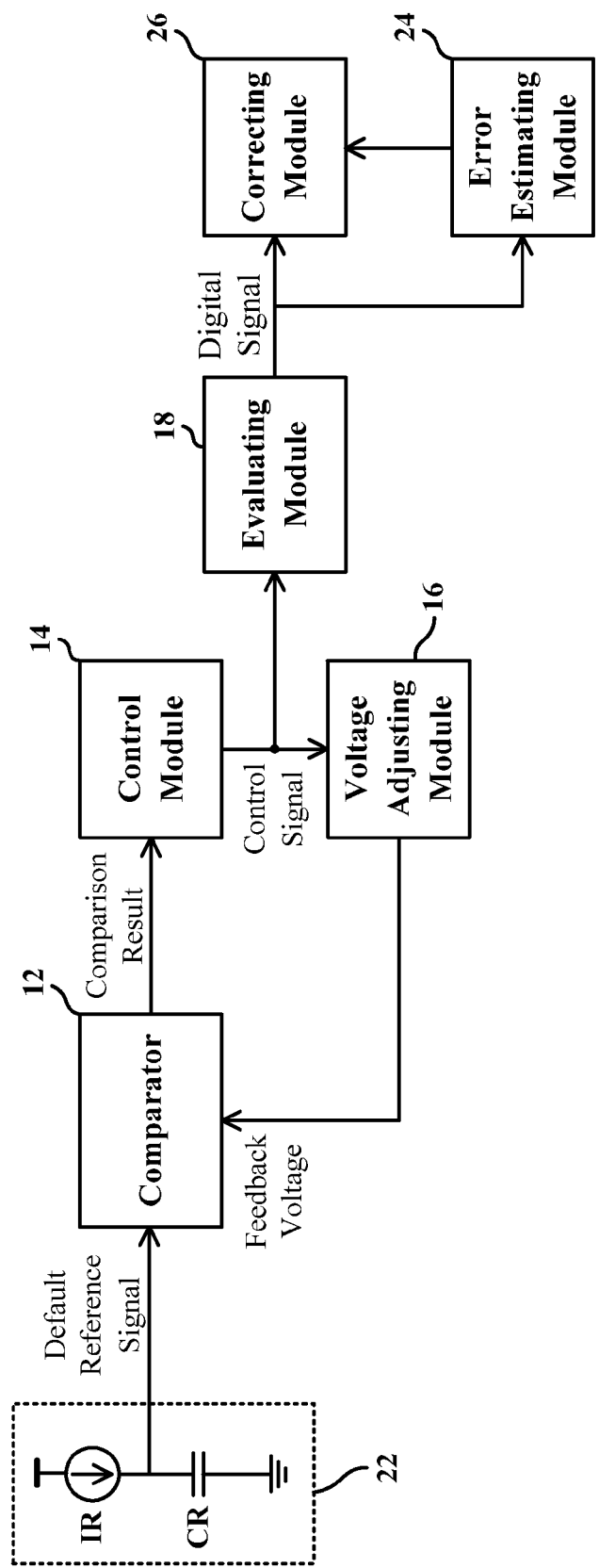
FIG. 7 illustrates an analog-to-digital converter further including correction circuits.

FIG. 7 illustrates another embodiment further including a correction function. The reference signal module 22 provides a default reference signal to the input end of the comparator 12 for receiving the analog input voltage. In this example, the reference signal module 22 includes a reference current source IR and a capacitor CR. The reference current source IR is used for charging the capacitor CR, so as to generate the default reference signal. By changing the current amount of the reference current source IR or the charge duration, the default reference signal can be adjusted. The voltage level and waveform of the default reference signal are previously known. The comparator 12, control module 14, voltage adjusting module 16, and evaluating module 18 can generate a digital signal corresponding to the default reference signal with the aforementioned process.

The error estimating module 24 is used for measuring the digital signal generated based on the default reference signal and comparing the digital signal with a standard digital signal. An estimated error is generated based on the difference between the digital signal and the standard digital signal. Then, based on the estimated error, the correcting module 26 corrects the following digital signals corresponding to actual analog input voltages. In practice, the correction process can be performed before the analog-to-digital converter starts to receive actual analog input voltages. The estimated error can be stored in the error estimating module 24 or the correcting module 26.

The analog-to-digital converter according to the invention can also have the function of correcting the current ratio N. The circuit in FIG. 3 can be taken as an example for explaining how to correct the current ratio N. First, the analog input voltage and feedback voltage are both reset to an initial feedback voltage. Then, the control module 14 requests the charge current source 16A to charge the capacitive component C for one clock period, so as to make the feedback voltage higher than the analog input voltage. The difference between the two voltages is one unit charge amount. Subsequently, the control module 14 requests the discharge current source 16B to discharge the capacitive component C. Theoretically, the feedback voltage should be decreased to equal to the analog input voltage again after N clock periods. Because of the non-ideality of the current sources, the feedback voltage is decreased to the initial feedback voltage after N' clock periods. For example, when N is designed as 128, N' may be 127 or 129. The evaluating unit 18C can correct the calculation equation from (P*N–Q) to (P*N'–Q).

As described above, new structures for analog-to-digital converters are proposed in the invention. Based on the voltage increasing/decreasing amounts used in the process of comparing an analog input voltage and a feedback voltage, the analog-to-digital converter according to the invention can estimate the voltage level of the analog input voltage. A digital signal corresponding to the analog input voltage can accordingly be generated by digital circuits easily. The structure of the analog-to-digital converters according to the invention is simple and can be implemented with low cost.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. An analog-to-digital converter, comprising:
   a comparator for comparing an analog input voltage with a feedback voltage, so as to generate a comparison result;
   a control module for generating a control signal based on the comparison result;
   a voltage adjusting module, according to the control signal, the voltage adjusting module increasing or decreasing the feedback voltage toward the analog input voltage; and
   an evaluating module for generating a first digital value and a second digital value based on the control signal, the first digital value being associated with a voltage increase amount provided by the voltage adjusting module, the second digital value being associated with a voltage decrease amount provided by the voltage adjusting module, the evaluating module also generating a digital signal corresponding to the analog input voltage based on the first digital value and the second digital value.

2. The analog-to-digital converter of claim 1, wherein the voltage adjusting module first adjusts the feedback voltage until the comparison result changes and then inversely adjusts the feedback voltage until the comparison result changes again.

3. The analog-to-digital converter of claim 1, wherein when the analog input voltage is higher than the feedback voltage, the comparison result has a first voltage level, when the analog input voltage is lower than the feedback voltage, the comparison result has a second voltage level different from the first voltage level.

4. The analog-to-digital converter of claim 1, wherein before the voltage adjusting module starts to adjust the feedback voltage, the control module first requests the voltage adjusting module to increase the feedback voltage if the comparison result reveals that the analog input voltage is higher than the feedback voltage; before the voltage adjusting module starts to adjust the feedback voltage, the control module first requests the voltage adjusting module to decrease the feedback voltage if the comparison result reveals that the analog input voltage is lower than the feedback voltage.

5. The analog-to-digital converter of claim 1, wherein the feedback voltage has an initial feedback voltage corresponding to a third digital value, and the evaluating module generates the digital signal based on the first, second, and third digital values.

6. The analog-to-digital converter of claim 5, further comprising:
   a reset module for resetting the feedback voltage to the initial feedback voltage before the voltage adjusting module starts to adjust the feedback voltage.

7. The analog-to-digital converter of claim 6, further comprising:
   a prediction module for determining the initial feedback voltage based on a history of the digital signal or a characteristic of the analog input voltage.

8. The analog-to-digital converter of claim 1, wherein the voltage adjusting module first increases or decreases the feedback voltage at a first adjusting rate and then inversely adjusts the feedback voltage at a second adjusting rate lower than the first adjusting rate.

9. The analog-to-digital converter of claim 1, wherein the voltage increase amount is the product of a voltage increasing rate and a voltage increasing duration; the voltage decrease amount is the product of a voltage decreasing rate and a voltage decreasing duration.

10. The analog-to-digital converter of claim 9, wherein the evaluating module comprises:
    a first counter for counting the voltage increasing duration based on the control signal; and
    a second counter for counting the voltage decreasing duration based on the control signal.

11. The analog-to-digital converter of claim 10, wherein a first counting result of the first counter is the first digital value, and a second counting result of the second counter is the second digital value.

12. The analog-to-digital converter of claim 10, wherein the voltage increasing rate is N times of the voltage decreasing rate, N is a positive number larger than one, and the evaluating module generates the digital signal by multiplying the first counting result by N and then subtracting the second counting result from the multiplying result.

13. The analog-to-digital converter of claim 12, further comprising:
    a correcting module for correcting the value N.

14. The analog-to-digital converter of claim 9, wherein the voltage adjusting module comprises
    a capacitive component, coupled between a ground node and an input end of the comparator for receiving the feedback voltage, having a default capacitive value;
    a charge current source, based on the comparison result, the control module selectively controlling the charge current source to provide a charge current for charging the capacitive component, so as to increase the feedback voltage; and
    a discharge current source, based on the comparison result, the control module selectively controlling the discharge current source to provide a discharge current for discharging the capacitive component, so as to decrease the feedback voltage;
    wherein the voltage increasing rate is the result of dividing the charge current by the default capacitive value; the voltage decreasing rate is the result of dividing the discharge current by the default capacitive value.

15. The analog-to-digital converter of claim 14, wherein the charge current source comprises a switch component coupled between the capacitive component and a power supply node; when the switch component is turned on, the capacitive component is charged.

16. The analog-to-digital converter of claim 1, further comprising:
    a reference signal module for providing a default reference signal as the analog input voltage;
    an error estimating module for measuring the digital signal generated based on the default reference signal and comparing the digital signal with a standard digital signal, so as to generate an estimated error; and
    a correcting module for correcting the digital signal based on the estimated error.

17. The analog-to-digital converter of claim 16, wherein the reference signal module comprises a reference current source and a capacitor, the reference current source is used for charging the capacitor, so as to generate the default reference signal; the default reference signal is adjustable.

18. An analog-to-digital converter, comprising:
    a comparator for comparing an analog input voltage with a feedback voltage, so as to generate a comparison result, wherein the analog input voltage is higher than an initial feedback voltage of the feedback voltage;
    a capacitive component coupled between a ground node and an input end of the comparator for receiving the feedback voltage;
    a control module for generating a control signal based on the comparison result;
    a charge current source, via the control signal, the control module first controlling the charge current source to provide a charge current for charging the capacitive component, so as to increase the feedback voltage, until the comparison result reveals that the feedback voltage is higher than the analog input voltage;
    a discharge current source, after the comparison result reveals that the feedback voltage is higher than the analog input voltage, via the control signal, the control module controlling the discharge current source to provide a discharge current for discharging the capacitive component, so as to decrease the feedback voltage, until the comparison result reveals that the feedback voltage is lower than the analog input voltage, the charge current being N times of the discharge current, wherein N is a positive number larger than one;
    a counter for counting, based on the control signal, when the charge current source charges the capacitive component, so as to generate a first counting result; the counter also counting, based on the control signal, when the discharge current source discharges the capacitive component, so as to generate a second counting result; and
    an evaluating module for generating a digital signal by multiplying the first counting result by N and then subtracting the second counting result from the multiplying result, wherein the digital signal is corresponding to the analog input voltage.

19. An analog-to-digital converter, comprising:
    a comparator for comparing an analog input voltage with a feedback voltage, so as to generate a comparison result, wherein the analog input voltage is lower than an initial feedback voltage of the feedback voltage;
    a capacitive component coupled between a ground node and an input end of the comparator for receiving the feedback voltage;
    a control module for generating a control signal based on the comparison result;
    a discharge current source, via the control signal, the control module first controlling the discharge current source to provide a discharge current for discharging the capacitive component, so as to decrease the feedback voltage, until the comparison result reveals that the feedback voltage is lower than the analog input voltage;
    a charge current source, after the comparison result reveals that the feedback voltage is lower than the analog input voltage, the control module controlling the charge current source to provide a charge current for charging the capacitive component, so as to increase the feedback voltage, until the comparison result reveals that the feedback voltage is higher than the analog input voltage, the discharge current being N times of the charge current, wherein N is a positive number larger than one;
    a counter for counting, based on the control signal, when the discharge current source discharges the capacitive component, so as to generate a first counting result; the counter also counting, based on the control signal, when the charge current source charges the capacitive component, so as to generate a second counting result; and
    an evaluating module for generating a digital signal corresponding to the analog input voltage by multiplying the first counting result by N and then subtracting the second counting result from the multiplying result.

* * * * *